(12) United States Patent
Sementchenko (10) Patent No.: US 6,215,307 B1
(45) Date of Patent: Apr. 10, 2001

(54) COILS FOR MAGNETIC RESONANCE IMAGING

(75) Inventor: Mikhail G. Sementchenko, St. Petersburg (RU)

(73) Assignee: Picker Nordstar Oy (FI)

( * ) Notice: Subject to any disclaimer, the term of this patent is extended or adjusted under 35 U.S.C. 154(b) by 0 days.

(21) Appl. No.: 09/151,863

(22) Filed: Sep. 11, 1998

(30) Foreign Application Priority Data

Apr. 14, 1998 (RU) .................................................. 98106937

(51) Int. Cl.$^7$ .................................................. G01R 33/20
(52) U.S. Cl. .......................................... 324/318; 324/322
(58) Field of Search ............................. 324/318, 300–322

(56) References Cited

U.S. PATENT DOCUMENTS 4,152,474 * 5/1979 Cook et al. ............................ 428/137
5,372,137 * 12/1994 Wong et al. ........................... 600/422
5,386,191 * 1/1995 McCarten et al. .................... 324/318
5,521,506 * 5/1996 Misic et al. ............................ 324/322

* cited by examiner

Primary Examiner—Christine Oda
Assistant Examiner—Tiffany A. Fetzner
(74) Attorney, Agent, or Firm—Timothy B. Gurin; John J. Fry

(57) ABSTRACT

An r.f. coil arrangement for use in a magnetic resonance imaging apparatus includes conductors etched on either side of a circuit board. Corresponding portions of conductors locating on opposite sides of the circuit board overlap so as to form a plurality of capacitors which provide electrical connection for current flowing in the coil. The conductors on the first side of the circuit board form a spiral in which the current flows from the outside of the spiral to the inside. The conductors on the second side form a spiral in which the current flows from the inside of the spiral to the outside. Auxiliary conductor portions may be readily disconnected from the main conductors so that the value of the capacitors may be adjusted.

24 Claims, 7 Drawing Sheets

Lower Side of Coil 58, 66

Upper Side of Coil 58, 66

Fig. 3
Lower Side of Coil 58, 66

Fig. 4
Upper Side of Coil 58, 66

Fig. 5

Fig. 6
Lower Side of Coil 54, 62

Fig. 7
Upper Side of Coil 54, 62

COILS FOR MAGNETIC RESONANCE IMAGING

BACKGROUND

The present invention relates to the field of magnetic resonance imaging. It finds particular application in conjunction with radio frequency (r.f.) coils for use therein.

Magnetic resonance imaging (MRI) is a widely used diagnostic imaging method. MRI equipment includes a magnet apparatus for generating a very strong, homogeneous static magnetic field within an examination region. A so-called "open" magnet arrangement includes a pair of pole pieces disposed on opposite sides of the examination region. MRI systems also include an r.f. coil arrangement for exciting and detecting magnetic resonance in the examination region. In order to excite magnetic resonance, transmit coils are used to generate a rotating r.f. field.

A number of sometimes conflicting considerations influence r.f. coil design. In order to maximize the size of the examination region, it is desirable that the coils be as thin as possible. At the same time, it is desirable that the coils be as efficient as possible, so that for a given input power, the coils produce a relatively large r.f. field. It is also necessary that the coils be tuned to the r.f. excitation frequency, for example the Larmor frequency of hydrogen atoms influenced by the static magnetic field. In order to generate an r.f. field which rotates in a plane perpendicular to the main magnetic field, two r.f. coils rotated 90 degrees with respect to each other have been provided, with the coils driven in quadrature.

R.f. coils for so-called open magnet systems have included planar butterfly coils. Each half of a butterfly coil includes a relatively small number of conductor turns (e.g., two) configured to produce the desired r.f. field within the examination region. The coils are connected by circuit traces to a "bank" of discrete tuning capacitors. This arrangement has various drawbacks. First, there tends to be significant capacitive coupling between the rotated coils. This, together with the high voltage present on the coils, has a deleterious effect on coil efficiency. In addition, the circuit bridges associated with the discrete tuning capacitors tend to be narrow, thereby increasing stored magnetic energy which does not contribute to the useful magnetic field. Further, the tuning capacitors themselves must be of relatively high quality and also tend to be bulky. While a larger number of coil turns is desirable, increasing the number of turns tended to decrease the self-resonant frequency of the coil so as to be below the Larmor frequency. Radial current components associated with the coils have also led to undesirable components in the r.f. field.

A pair of coils has been associated with the upper pole piece and a corresponding pair associated with the lower pole piece. The coils nearest to the pole pieces have been oriented in a first angular position, and the coils nearest to the imaging region have been oriented at a second angular position rotated about the z-axis offset ninety degrees from the first. The coils nearest the pole piece have been driven to produce a first component of the rotating r.f. field, while the coils nearest the imaging region have been driven to produce a ninety degree offset field component. However, the efficiency of the coil pair nearer the pole pieces (and hence the r.f. screen or shield) has been lower than that of the pair nearer the examination region. As a consequence, the r.f. field at the center of the imaging region has had a undesirable linear component resulting from the difference in amplitude of the zero and ninety degree components.

The method and apparatus disclosed herein address these drawbacks, and others.

SUMMARY

According to a first aspect of the present invention, a magnetic resonance imaging apparatus includes a magnet including first and second pole pieces disposed on opposite sides of an examination region, means for generating time-varying gradient magnetic fields within the examination region, means for exciting magnetic resonance in an object located in the examination region, means for detecting magnetic resonance in the object, and means for generating an image indicative of the magnetic resonance signals detected by means for detecting. The means for exciting includes a coil for generating an r.f. field in the examination region. The coil includes a substrate having first and second major surfaces, a first coil segment disposed on the first major surface and a second coil segment disposed on the second major surface and connected electrically in series with the first coil segment. Overlapping portions of the first and second coil segments form a capacitor which provides the electrical connection therebetween.

According to a more limited aspect, the apparatus includes a first plurality of coil segments disposed on the first major surface and a second plurality of coil segments disposed on the second major surface. Overlapping portions of corresponding coil segments disposed on the first and second major surfaces form a capacitor which provides a series electrical connection therebetween.

According to a still more limited aspect of the present invention, the first and second plurality of coil segments form a generally spiral winding.

According to another more limited aspect, the winding is characterized by six turns.

According to another yet more limited aspect, the apparatus includes means for canceling radial current components.

According to another limited aspect of the present invention, the resonant frequency of the coil is equal to the frequency of an excitation signal applied to the coil.

According to another more limited aspect of the present invention, the width of the overlapping portion of the coil segments is equal to the width of the non-overlapping portion.

According to yet another limited aspect of the present invention, the apparatus further includes means for adjusting the area of the overlap between the first and second coil segments.

According to still another limited aspect of the present invention, the means for exciting includes a first coil disposed between the first pole piece and the examination region, a second coil disposed between the first coil and the examination region, a third coil disposed between the second pole piece and the examination region, and a fourth coil disposed between the third coil and the examination region. The first and fourth coils generate a first r.f. field component, and the second and third coils generate an r.f field component ninety degrees offset from the first r.f. field component.

According to a yet another limited aspect of the present invention, the substrate comprises woven fiberglass and PTFE.

According to another aspect of the present invention, a magnetic resonance examination apparatus includes open magnet means for generating a magnetic field in an examination region, means for imposing a series of time varying gradients on the main magnetic field, and means for detecting magnetic resonance in the examination region. The r.f. coil includes a plurality of capacitors and a plurality of coil segments connected electrically in series. The electrical connection between successive coil segments is provided by a capacitor.

According to a more limited aspect of the invention, the coil includes an insulating substrate having first and second sides. Successive ones of the coil segments are disposed on alternating first and second sides of the substrate. According to a still more limited aspect, the capacitors are formed by overlapping portions of successive ones of the coil segments. According to a still more limited aspect, the apparatus includes means for adjusting the capacitance of the capacitors.

According to another limited aspect of the invention, the coil is formed by etching a desired conductor pattern on a circuit board.

According to another more limited aspect, a coil segment on the first side of the substrate overlaps a coil segment on the second side of the substrate at a location where current flowing through each coil segment has a radial component and the voltage on each coil segment is zero. The respective coil segments at the location are arranged so that their radial current components are equal and opposite.

According to another limited aspect, the coil includes a plurality of capacitors for matching the coil to an r.f. cable. The capacitors are formed by overlapping conductors disposed on opposite sides of the substrate.

DESCRIPTION

Figure 1:
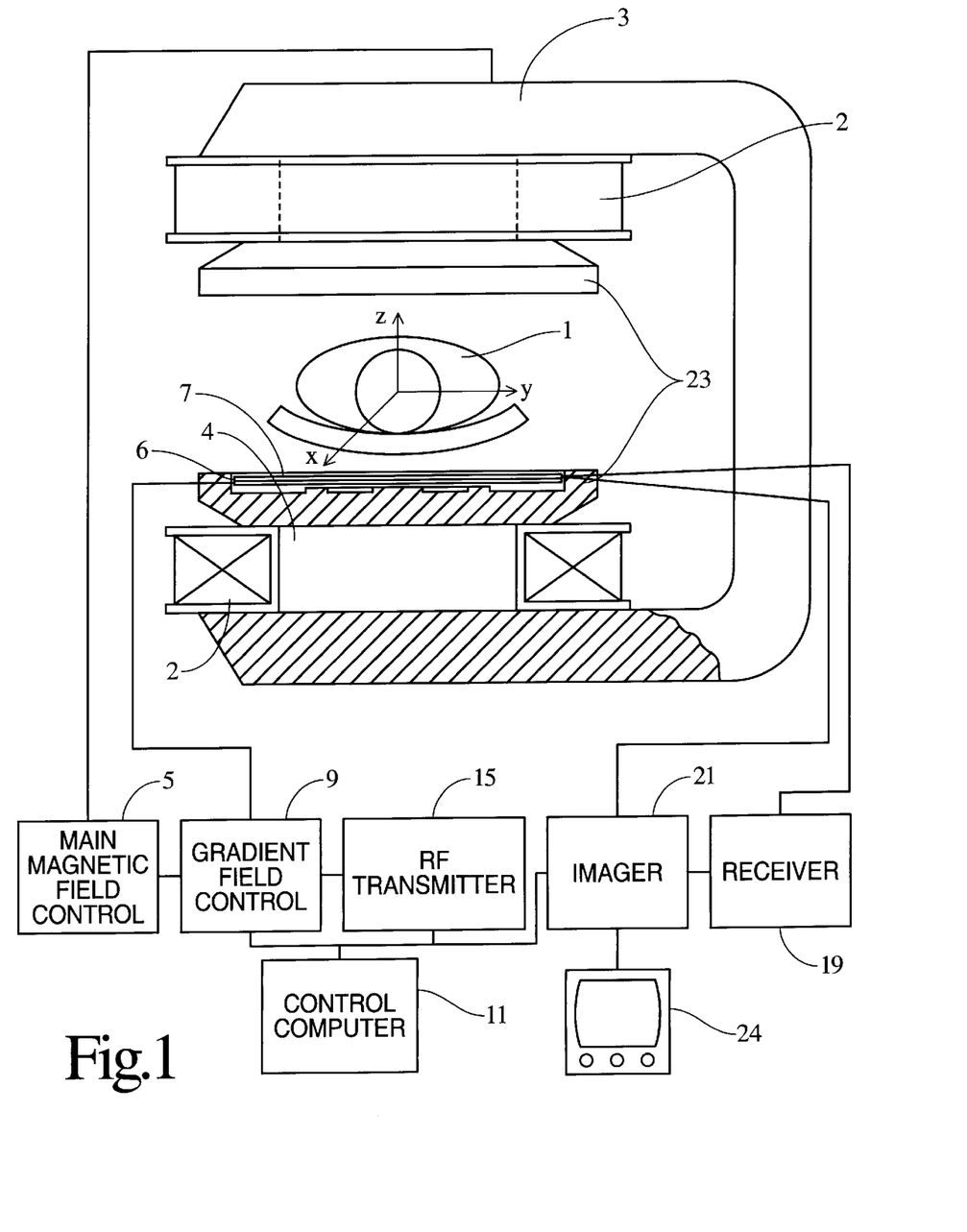
FIG. 1 depicts a magnetic resonance imaging apparatus according to the present invention.

With reference to FIG. 1, an MRI apparatus which produces images of the anatomy of patient 1 includes a generally c-shaped magnet body 3. The patient 1 is placed in an imaging region located between a pair of opposed pole pieces 23. A main magnetic field control 5 supplies energizing current to the driver coils 2 associated with each pole so as to generate the main magnetic field Bo in the z direction. Necks 4 connect the pole pieces 23 to the body 3 of the magnet, thereby providing a return path through the body of the magnet.

Gradient coil assemblies 6 located between each pole piece 23 and the imaging region generate time-varying gradient magnetic fields, preferably in three orthogonal directions (e.g., x, y, z). The respective gradient coils are energized by a gradient field controller 9 which contains a gradient field amplifier associated with each coil. The gradient controller 9 is in turn controlled by a computer 11 to generate time varying gradient sequences necessary to carry out a desired magnetic resonance excitation and detection sequence.

An r.f. coil system 7 is used to excite and detect magnetic resonance in the object being examined. Separate transmit and receive coils are preferably provided. Alternately, a single coil may be operated in both transmit and receive modes. While only the coils 7 associated with the lower pole piece are illustrated, a second set of r.f. coils is similarly located in relation to the upper pole piece as more fully described below.

To excite magnetic resonance in the object, a transmit coil system is energized by an r.f. transmitter 15 under control of the computer 11 to apply an r.f. field. To detect magnetic resonance signals, signals received by a receive coil are passed via a receiver 19 to an imager 21 which, under control of the computer 11, processes the signals to produce an image representative of the patient's body. These signals are, in turn, passed to display device 24 to provide a human-readable display of the image.

In operation of the apparatus, the strong magnetic field provided by the magnet defines an equilibrium axis of magnetic alignment in the body of the patient 1. To obtain an image of a selected region, e.g. a cross-sectional slice of the body, an r.f. field pulse is first applied to the patient 1 using coil system 7 to excite magnetic resonance in the selected region. To this end, the coil system 7 produces a field in a direction orthogonal to the static field direction so as to tip the spins of nuclei in the selected region from the direction of the static field. To restrict excitation to a desired region, the r.f. field pulse is applied in conjunction with magnetic field gradients imposed by the gradient coil assemblies 6, the frequency of the r.f. field being chosen in conjunction with the magnitudes and directions of the imposed gradients so that the Larmor frequency protons in the body, e.g. hydrogen protons, is equal to the r.f. field frequency only in the desired region.

The r.f. signals resulting from excitation are then spatially encoded by application of one or more further gradient magnetic fields in known manner, detected by the r.f. coil system 7, and processed to produce an human-readable image, for example on display device 24. Normally, a number of excitation and signal detection sequences are required to collect sufficient data to produce a satisfactory image.

Figure 2:
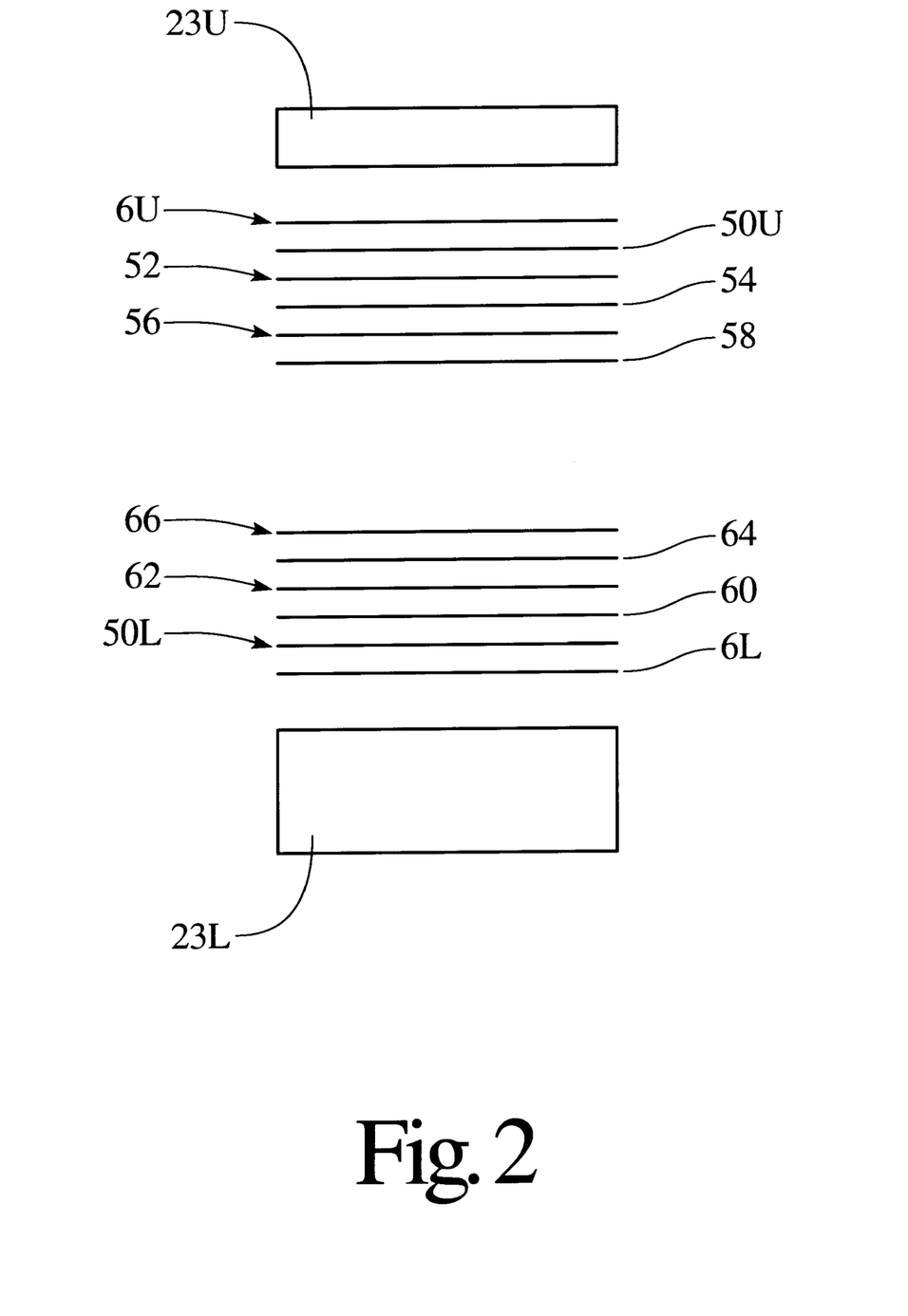
FIG. 2 is a schematic side view of magnetic resonance imaging apparatus depicting the relative locations of the r.f. transmit coils.

With reference to FIG. 2, upper gradient coils 6U are located between the upper pole piece 23U and the examination region. Disposed between the upper gradient coils 6U and the examination region is an r.f. shield or screen 50U made from a conductive material such as a copper mesh, an insulating layer 52, a first r.f. coil 54, an insulating layer 56, and a second r.f. coil 58. Lower gradient coils 6L are likewise located between the lower pole piece 23L and the examination region. Disposed between the lower gradient coils 6L and the examination region is a second r.f. screen 50L, an insulating layer 60, a third r.f. coil 62, an insulating layer 64, and a fourth r.f. coil 66. Receive coils (not shown) are located between the transmit coils and the examination region. In order to minimize stray capacitance between the respective layers, the insulating layers 52, 56, 60, 64 are fabricated from a material having a dielectric constant close to one such as a polymer PVC foam material.

The r.f. transmit coils 54, 58, 62, 66 each include electrical conductors disposed on both sides of an insulating substrate. Preferably, a commercially available circuit board material such as woven fiberglass coated with PTFE plated on both sides with copper is used. Suitable conductor patterns are etched in the copper plating. It is desirable that the circuit board material be as thin as possible and have a relatively high dielectric constant. In order to ensure repeatability and stability of the coil tuning, the material's dielectric constant to thickness ratio should be consistent and as stable as possible from unit to unit and throughout the anticipated operating ambient temperature range of the coil. Satisfactory operation has been achieved, for example, using a substrate having a thickness of 0.5 mm and a dielectric constant of approximately 2.55.

Figure 3:
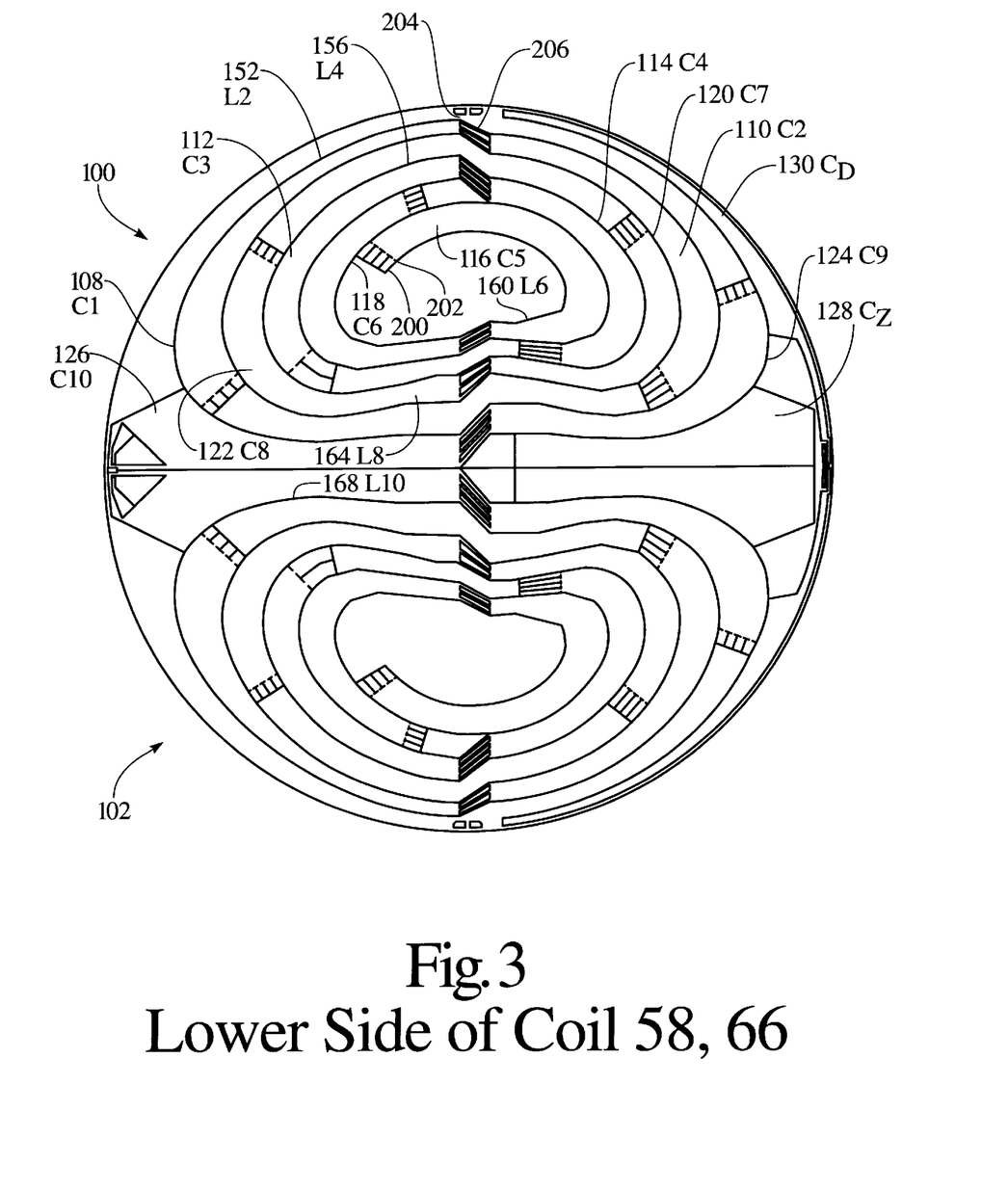
FIG. 3 is a top view of the lower layer of a first r.f. coil.
Figure 4:
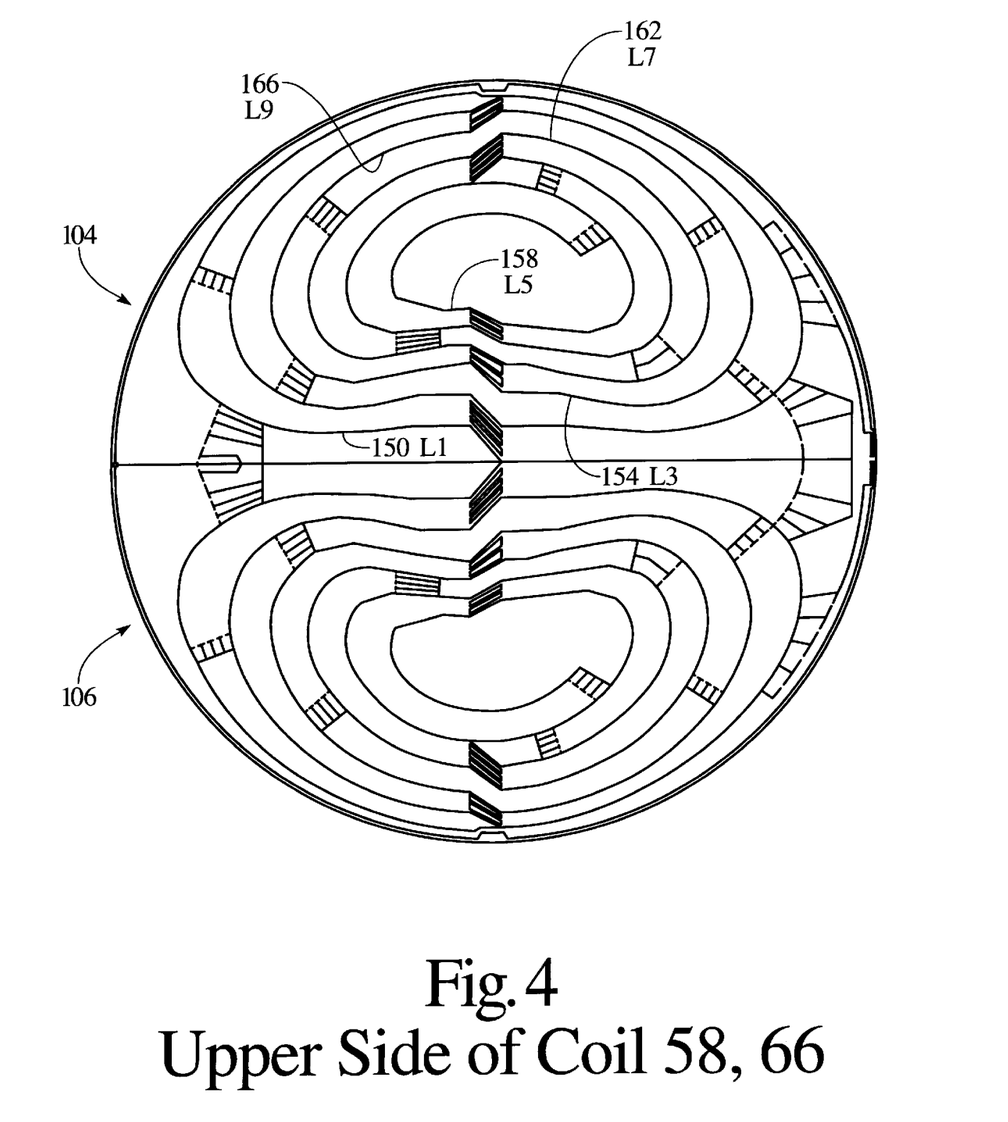
FIG. 4 is a top view of the upper layer of the first r.f. coil.

FIG. 3 shows the conductor pattern for the lower side of coils 58 and 66, with copper indicated in black. The lower side includes generally symmetrical first 100 and second 102 halves. FIG. 4 shows the conductor pattern for the upper side of coils 58 and 66. The upper side also includes generally symmetrical first 104 and second 106 halves. The conductors on the upper and lower sides, when superimposed, combine to provide a multi-turned spiral conductor pattern on the both the left and right coil halves.

With continuing reference to FIGS. 3 and 4 and focusing on the first half 104 of the coil, the coils 58, 66 include conductors 150, 152, 154, 156, 158, 160, 162, 164, 166, 168, and 170 characterized by a corresponding inductance designated as L1, L2 . . . L11 on FIGS. 3 and 4. The conductors of the lower side of the coils overlap the conductors on the upper side in the areas marked 108, 110, 112, 114, 116, 118, 120, 122, 124, and 126 on FIG. 3 so as to form the plates of the capacitors designated as C1, C2, . . . C10. Additional overlaps occur at the areas marked 128 and 130 so as to form the plates of capacitors designated as Cz and Cd. Capacitors Cz and Cd form a capacitive divider network which facilitates matching with a 95– 100 ohm r.f. cable. The capacitance of the capacitors may be calculated based on the area of the overlap (e.g. the plate area), the distance between the conductors, and the dielectric constant of the circuit board substrate. Preferably, the value of each of the capacitors is selected to compensate for the voltage generated in the inductance of a corresponding coil segment. At the excitation frequency, its capacitive reactance of each capacitor is equal to the inductive reactance of a corresponding coil segment. In the illustrated embodiment, each half of the coil includes six turns.

Figure 5:
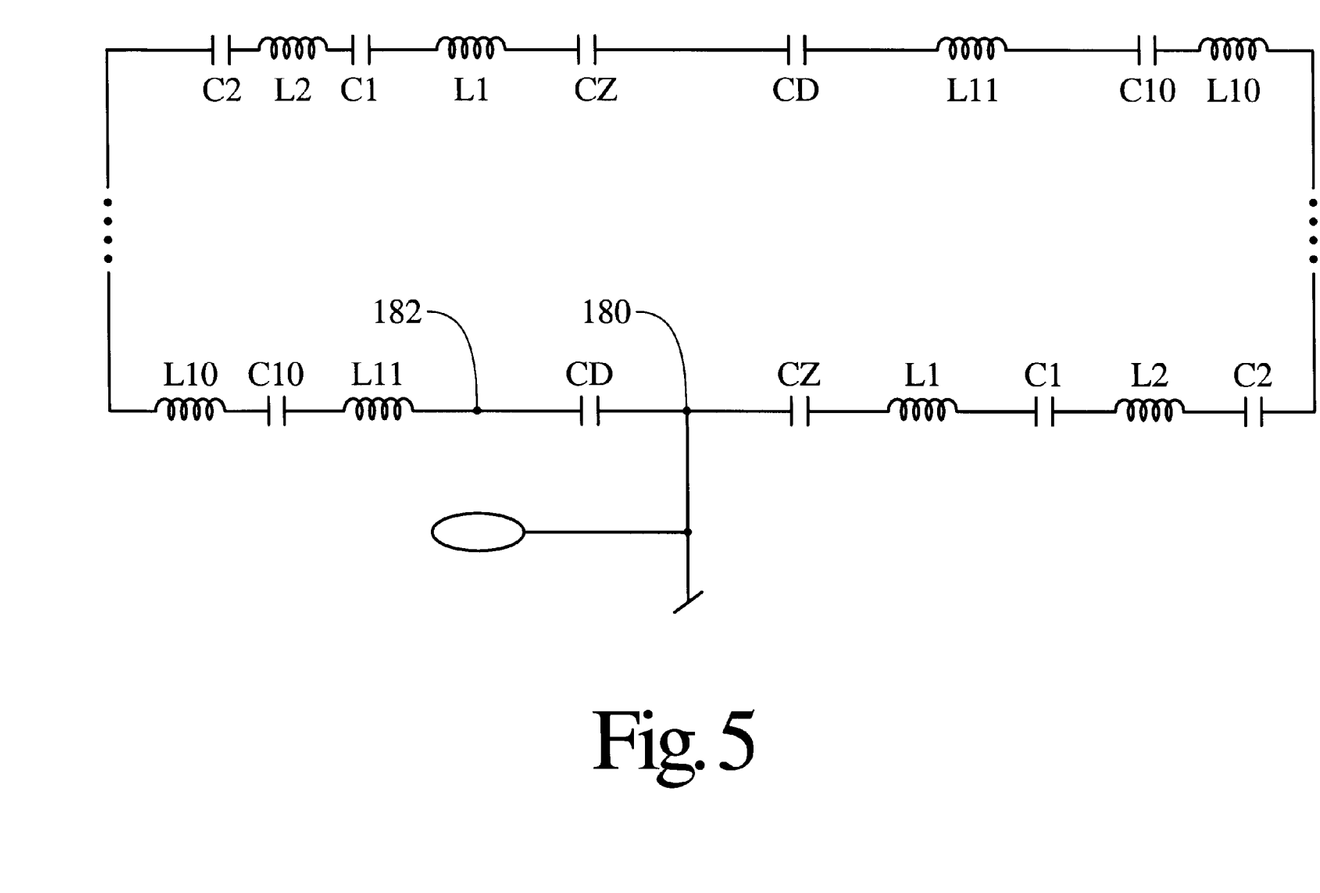
FIG. 5 is a an equivalent circuit for an r.f. coil.

While the foregoing discussion has focused on the first half of the coil, it is equally applicable to the second half. The corresponding coil halves are connected so that the equivalent circuit of the coil is as shown in FIG. 5. R.f. connections to the coil are made at points 180 and 182. As will be appreciated, the r.f. current through the coil passes through the capacitors formed through the circuit board substrate. Thus, the coil substrate and the conductors themselves form the requisite capacitors so that each half of the coil may be modeled as a series L-C circuit. The resonant frequency of the coil is the same as the frequency of the excitation signal applied to the coil.

Associated with each of the overlap areas, in FIG. 3, is a plurality of auxiliary conductors 200, each having an area which allows the value of each capacitor to be varied. Each auxiliary conductor 200 is connected to the corresponding main conductor by a relatively thin electrically conductive circuit trace 202. The area of the overlap, and hence the capacitance, may readily be adjusted by severing the thin trace 202. This in turn facilitates tuning of the coil. Alternately, other techniques for altering the overlap area may be provided. For example, the auxiliary conductors could be electrically isolated from the main conductors with electrical jumpers or connectors inserted as necessary, or additional conductor material may be affixed to the coil substrate in areas reserved for that purpose. Depending on the uniformity of the circuit board substrates, the etching process, the reproducibility of the r.f. shield shape, and the required tuning tolerance, the auxiliary conductors may be omitted.

With the exception of the overlap areas, the overlap between the conductors on the first and second sides is preferably minimized. Where the circuit configuration necessitates additional overlaps, corresponding bridge areas 204, 206 are provided. The conductors in the respective bridge areas are oriented at angle so as to minimize coupling between the layers. Surface area and hence capacitive coupling in the bridges is also advantageously reduced by configuring each bridge area 204, 206 to include a plurality of relatively narrower conductive bridge areas 206.

To minimize current flow between the first and second layers resulting from any stray capacitance, the bridges are preferably located where the voltage between the respective conductors is as low as possible. As noted above, it is desirable that the capacitors located in each turn compensate for the voltage accumulated in the turn so that the voltage along the coil remains relatively low. As can be seen from FIGS. 3, 4, 6, and 7, the bridge areas may be advantageously located along a line of symmetry of the coil. Based on a desired location for the bridges, the value of the capacitors is selected so that the voltage at the bridge areas is as low as possible. Stated another way, the voltage is made as low as possible at the pre-defined bridge locations.

The conductors in each half of the coil are arranged so that the current flowing in a direction perpendicular to the conductors is substantially canceled. In particular, each bridge 204 introduces a radial current component. However, the corresponding bridge 206 on the other side of the circuit board introduces an equal but opposite radial current component. As a result, the sum of the radial current components introduced by the individual bridges is substantially zero. Thus, a generally spiral winding pattern may be provided while undesirable radial current components are canceled.

The operational characteristics of the r.f. coil are dependent on a number of interdependent variables. In particular, it is desirable that the rotating r.f. field strength be constant over the imaging region and that undesirable spherical harmonics in the rotating r.f. field decomposition be avoided.

In order to minimize the power requirements of the r.f. amplifier and maximize the r.f. field strength, it is also desirable that the magnetic energy stored in the coil be as low as possible. Stated another way, it is desirable that the inductance of the r.f. coil be as low as possible.

In order to provide maximum patient space, the r.f. coil should be as thin as possible.

It will be appreciated, however, that a practical coil represents a compromise between these requirements.

Hence, the configuration of the coil is preferably optimized using a numerical optimization procedure as is conventional in the art. In order to reduce the complexity of the optimization and to remove undesirable spherical harmonics from the r.f. field decomposition, the shape of turns is expressed via current distribution function V(r), where r is the radius of a point on a layer.

The function V(r) describes the turns as follows. The boundary between two neighboring turns is a plurality of points which satisfies the expression $$U(r,\phi) = V(r) \cdot \cos(\phi)$$

where φ is the angular position about the x, y plane.

A numerical optimization is utilized to determine the function V(r) using the cost function:

$$C(V) = a_L C_L(V) + a_E E(V)$$

where $C_L(V)$ is a cost function component related to the r.f. field non-homogeneity inside the imaging volume and $E(V)$ is the total magnetic energy. Coefficients $a_L$ and $a_E$ define the relative importance of each of the terms.

Figure 6:
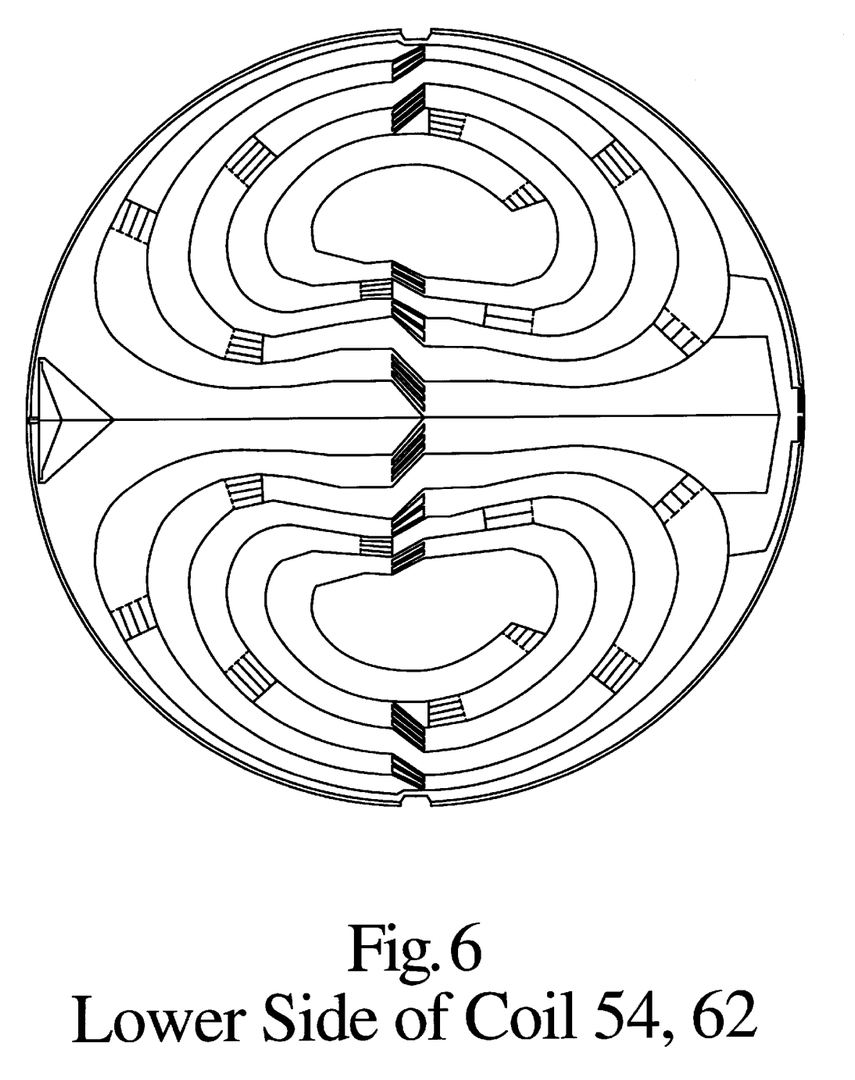
FIG. 6 is a top view of the lower layer of a second r.f. coil.
Figure 7:
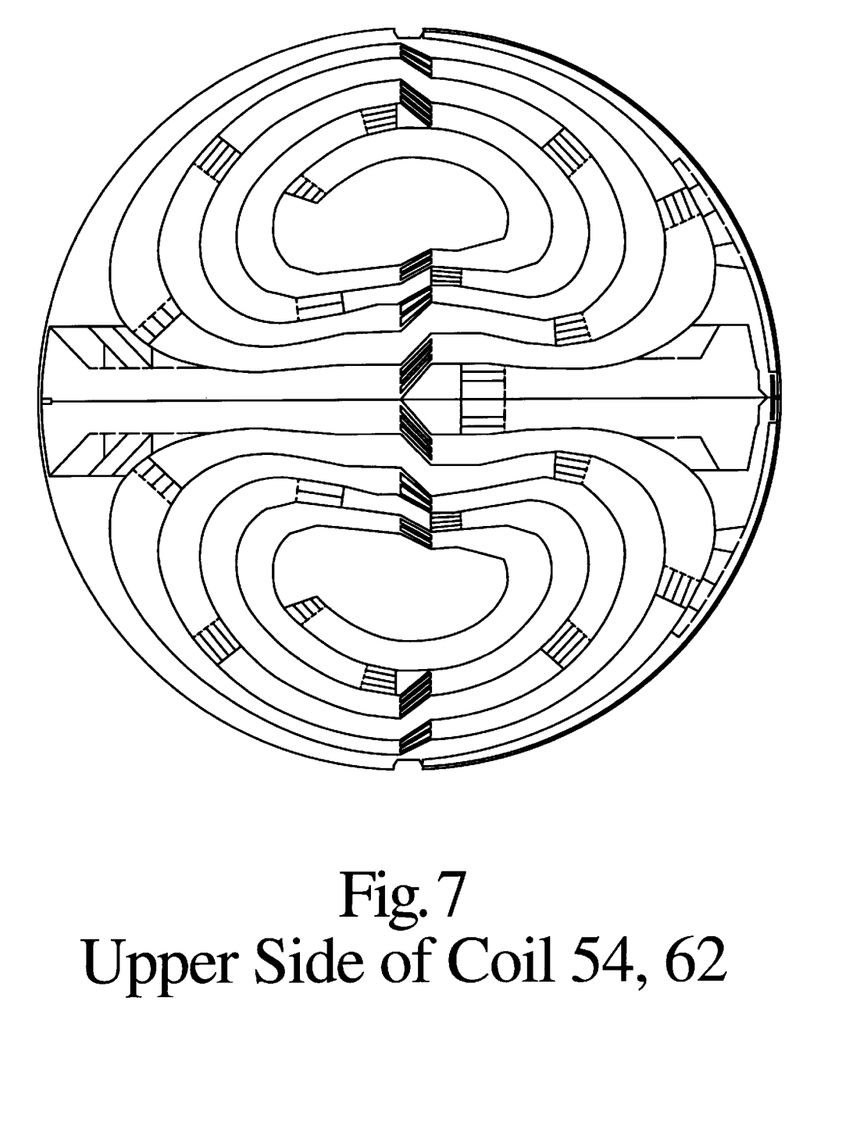
FIG. 7 is a top view of the upper layer of the second r.f. coil.

While the foregoing discussion has focused on the inner coils 58, 66, it will be appreciated that the foregoing discussion is equally applicable to the outer coils 54, 62, the lower and upper layers of which are depicted in FIGS. 6 and 7, respectively. The shape of the outer coils 54, 62 is optimized as described above for the inner coils 58,66, taking into account their differing distance from the r.f. shield 50U, 50L. The area (and hence the value) of the capacitors in the outer coils 54, 62 tends to be greater than the capacitors in the inner coils 58,66. The inductance of the outer coils 54, 62 tends to be lower since these coils are located nearer the r.f. screens 50U, 50L. For a given frequency, then, the required capacitance is greater.

The layers of the coils are also ordered so as to optimize the electric decoupling between the inner an outer coils. In order to minimize the effects of the spare capacitance, the layers are arranged so that layers of adjacent coils carrying, on average, the smaller potential are closest together.

The first r.f. coil 54 and the fourth r.f. coil 66 are mounted in the x-y plane at corresponding angular position with respect to the z-axis and are driven so as to produce the zero degree component of the r.f. field. The second r.f. coil 58 and the third r.f. coil 62 are mounted at a corresponding angular position offset by 90 degrees from that of the first 54 and fourth 66 coils and are driven so as to produce a 90 degree component of the r.f. field. The zero and ninety degree coils are driven in quadrature so as to produce the rotating r.f field.

A particular advantage of preferred embodiment is that, compared to previous techniques, a relatively larger number of coil turns may be used. In the embodiment described, each coil half includes six coil turns. For a desired operating frequency, the number of turns is limited by the inability to tune the coil based on the spare capacitance to the second coil and to the r.f. shield. Inasmuch as the larger number of turns permits thinner conductor traces to be used, r.f. current redistribution caused by eddy currents in the conductors is also reduced.

At the same time, the distribution of the capacitance among the turns reduces the voltages between the coil components and ground. Because the current flowing through any stray capacitance is proportional to the voltage, this in turn reduces current flow between the coil and ground and between the quadrature coils, thereby increasing overall efficiency or allowing the spacing between the quadrature coils to be reduced.

Yet another advantage of the preferred embodiment is that the amplitudes of the zero and ninety degree components of the rotating r.f. field are equalized. The r.f. fields produced by the r.f. coils 58, 66 which are closer to the examination region is typically greater than that created by the coils closer to the r.f. screens 50U, 50L. In the arrangement of the preferred embodiment, the amplitudes of the zero and ninety degree components at the center of the imaging region are equalized. Thus, as compared to traditional arrangements, more of the energy contributes to generation of the useful r.f. field. Yet another advantage is that the upper and lower r.f. coil assemblies may be mechanically identical.

The invention has been described with reference to the preferred embodiment. Obviously, modifications and alterations will occur to others upon reading an understanding the preceding description. It is intended that the invention be construed as including all such modifications and alterations insofar as they come within the scope of the appended claims or the equivalents thereof.

What is claimed is:

1. A magnetic resonance imaging apparatus comprising:
   a magnet including first and second pole pieces disposed on opposite sides of an examination region;
   means for generating time-varying gradient magnetic fields in the examination region;
   means for exciting magnetic resonance in the examination region, the means for exciting including a first coil for generating an r.f. field in the examination region, the coil including
   a substrate having first and second major surfaces;
   a first coil segment disposed on the first major surface of the substrate;
   a second coil segment disposed on the second major surface of the substrate and connected electrically in series with the first coil segment, the first and second coil segments overlapping so as to form a capacitor, said capacitor providing the series electrical connection therebetween;
   means for detecting signals indicative of magnetic resonance in the examination region;
   means for generating an image indicative of magnetic resonance signals detected by the means for detecting.

2. The apparatus of claim 1 wherein the coil includes a plurality of coil segments disposed on the first and second surfaces of the substrate and connected electrically in series, successive ones of said series-connected coil segments disposed on alternating first and second major surfaces of the substrate and overlapping so as to form a capacitor, said capacitor providing the series electrical connection therebetween.

3. The apparatus of claim 2 wherein the coil segments form a generally spiral winding.

4. The apparatus of claim 3 wherein the winding has six turns.

5. The apparatus of claim 3 further including means for canceling radial current components.

6. The apparatus of claim 1 wherein the resonant frequency of the coil is equal to the frequency of an excitation signal applied to the coil.

7. The apparatus of claim 1 wherein the first and second coils segments are partially overlapping and the width of the overlapping portion of the coil segments is equal to the width of the non-overlapping portions of the coil segments.

8. The apparatus of claim 1 further including means for adjusting the area of the overlap between the first and second coil segments.

9. The apparatus of claim 1 wherein the first coil is disposed between the first pole piece and the examination region and the means for exciting further includes a second coil disposed between the first coil and the examination region, a third coil disposed between the second pole piece and the examination region, and a fourth coil disposed between the third coil and the examination region, the first and fourth coils generating a first r.f. field component, the second and third coils generating an r.f. field component ninety degrees offset from the first r.f. field component.

10. The apparatus of claim 1 wherein the substrate comprises woven fiberglass and PTFE.

11. The apparatus of claim 1 wherein the configuration of the coil is optimized using a numerical optimization procedure.

12. The apparatus of claim 1 further including a second coil for generating an r.f. field in the examination region and a polymeric foam material disposed between the first and second coils.

13. The apparatus of claim 1 wherein the means for detecting includes the first coil.

14. A magnetic resonance examination apparatus comprising:
   open magnet means for generating a magnetic field in an examination region;
   means for imposing a series of time varying gradients on the main magnetic field;
   a radio frequency transmitter;
   a radio frequency coil operatively connected to the radio frequency transmitter for exciting magnetic resonance in the examination region, the coil including
      a plurality of capacitors;
      a plurality of coil segments connected electrically in series, the electrical connection between successive coil segments being provided by a capacitor;
      an insulating substrate having first and second sides and successive ones of the coil segments are disposed on alternating first and second sides of the substrate;
   a radio frequency receiver for receiving signals indicative of magnetic resonance in the examination region.

15. The apparatus of claim 14 wherein the capacitors are formed by overlapping portions of successive ones of the series-connected coil segments.

16. The apparatus of claim 15 further including means for adjusting the capacitance of the capacitors.

17. The apparatus of claim 14 wherein the coil is formed by etching a desired conductor pattern on a circuit board.

18. The apparatus of claim 14 wherein the coil segments on the first side of the substrate form a spiral in which current flows from the outside of the spiral to the inside of the spiral and the coil segments on the second side of the substrate form a spiral in which current flows from the inside of the spiral to the outside of the spiral.

19. The apparatus of claim 17 wherein a coil segment on the first side of the substrate overlaps a coil segment on the second side of the substrate at a location where current flowing through each coil segment has a radial component and the voltage on each coil segment is zero, the respective coil segments at the location being arranged so that their radial current components are equal and opposite.

20. The apparatus of claim 14 wherein the radio frequency coil is operatively connected to the radio frequency receiver.

21. The apparatus of claim 14 wherein the coil includes a plurality of capacitors for matching the coil to an r.f. cable, the capacitors being formed by overlapping conductors disposed on opposite sides of the substrate.

22. The apparatus of claim 14 wherein the configuration of the coil is determined using a numerical procedure based on the homogeneity of an r.f. field generated by the coil and the total magnetic energy stored in the coil.

23. The apparatus of claim 14 further including an r.f. shield located in spaced relation to the first coil and a layer of a polymeric foam material disposed between the r.f. shield and the first coil.

24. An r.f. coil apparatus for use with a magnetic resonance imaging apparatus which generates a main magnetic field, the coil apparatus comprising:
   a substrate having first and second major surfaces;
   a plurality of electrically conductive coil segments disposed on the first and second surfaces of the substrate and connected electrically in series, successive ones of said series-connected coil segments disposed on alternating first and second major surfaces of the substrate and partially overlapping so as to form a capacitor, said capacitor providing the series electrical connection therebetween,
   wherein said coil apparatus is adapted for operation in the main magnetic field of the magnetic resonance imaging apparatus.

* * * * *